(12) United States Patent
Furuie

(10) Patent No.: US 9,337,242 B2
(45) Date of Patent: May 10, 2016

(54) DISPLAY DEVICE

(71) Applicant: Japan Display Inc., Tokyo (JP)

(72) Inventor: Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/608,317

(22) Filed: Jan. 29, 2015

(65) Prior Publication Data

US 2015/0214280 A1 Jul. 30, 2015

(30) Foreign Application Priority Data

Jan. 30, 2014 (JP) .................................. 2014-015941

(51) Int. Cl.
| | |
|---|---|
| *H01L 29/20* | (2006.01) |
| *H01L 27/15* | (2006.01) |
| *H01L 33/00* | (2010.01) |
| *H01L 21/00* | (2006.01) |
| *H01L 27/32* | (2006.01) |

(52) U.S. Cl.
CPC ........ *H01L 27/3218* (2013.01); *H01L 27/3213* (2013.01); *H01L 27/3216* (2013.01)

(58) Field of Classification Search
CPC ............ H01L 27/3218; H01L 27/3216; H01L 27/3211; H01L 51/5203; H01L 27/3244; H01L 27/3213

USPC .................. 257/79, 88, 89, 99, 440, E33.062, 257/E33.073, 433, E31.117; 438/29, 34, 438/22, 67; 345/694
See application file for complete search history.

(56) References Cited

U.S. PATENT DOCUMENTS

| | | | |
|---|---|---|---|
| 2004/0046725 A1* | 3/2004 | Lee .................................. | 345/88 |
| 2004/0095521 A1* | 5/2004 | Song et al. ....................... | 349/61 |
| 2004/0217694 A1* | 11/2004 | Cok et al. ....................... | 313/504 |
| 2007/0057901 A1* | 3/2007 | Chino ............................ | 345/102 |
| 2007/0159492 A1* | 7/2007 | Lo et al. ......................... | 345/589 |
| 2008/0150863 A1* | 6/2008 | Morisue et al. ................. | 345/88 |
| 2009/0302331 A1 | 12/2009 | Smith | |
| 2009/0322802 A1* | 12/2009 | Noguchi et al. .............. | 345/694 |

FOREIGN PATENT DOCUMENTS

| | | |
|---|---|---|
| JP | 2007-227274 A | 9/2007 |
| JP | 2009-533810 A | 9/2009 |

* cited by examiner

*Primary Examiner* — Long K Tran
*Assistant Examiner* — Dzung Tran
(74) *Attorney, Agent, or Firm* — Typha IP LLC

(57) ABSTRACT

A display device is provided including a display region arranged with a plurality of main pixels formed from a group including a red pixel, green pixel, blue pixel and white pixel, wherein the main pixel includes an arrangement in which the white pixel is adjacent to a pixel other than the blue pixel, and the display region is arranged so that white pixels in each of the main pixels are mutually adjacent. In the main pixel, the white pixel may be adjacent to the green pixel. In addition, in the main pixel, the blue pixel may be adjacent to the red pixel.

9 Claims, 20 Drawing Sheets

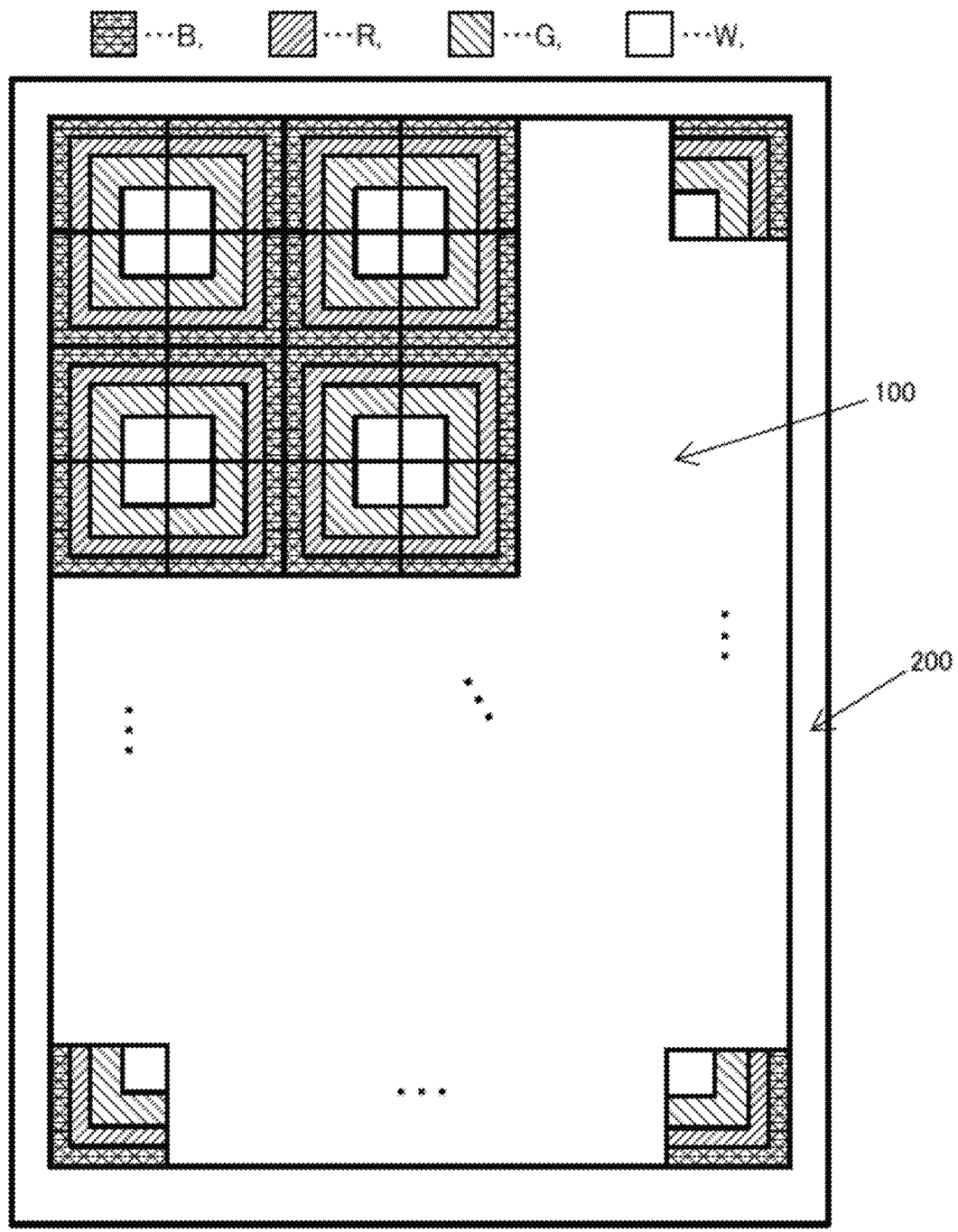

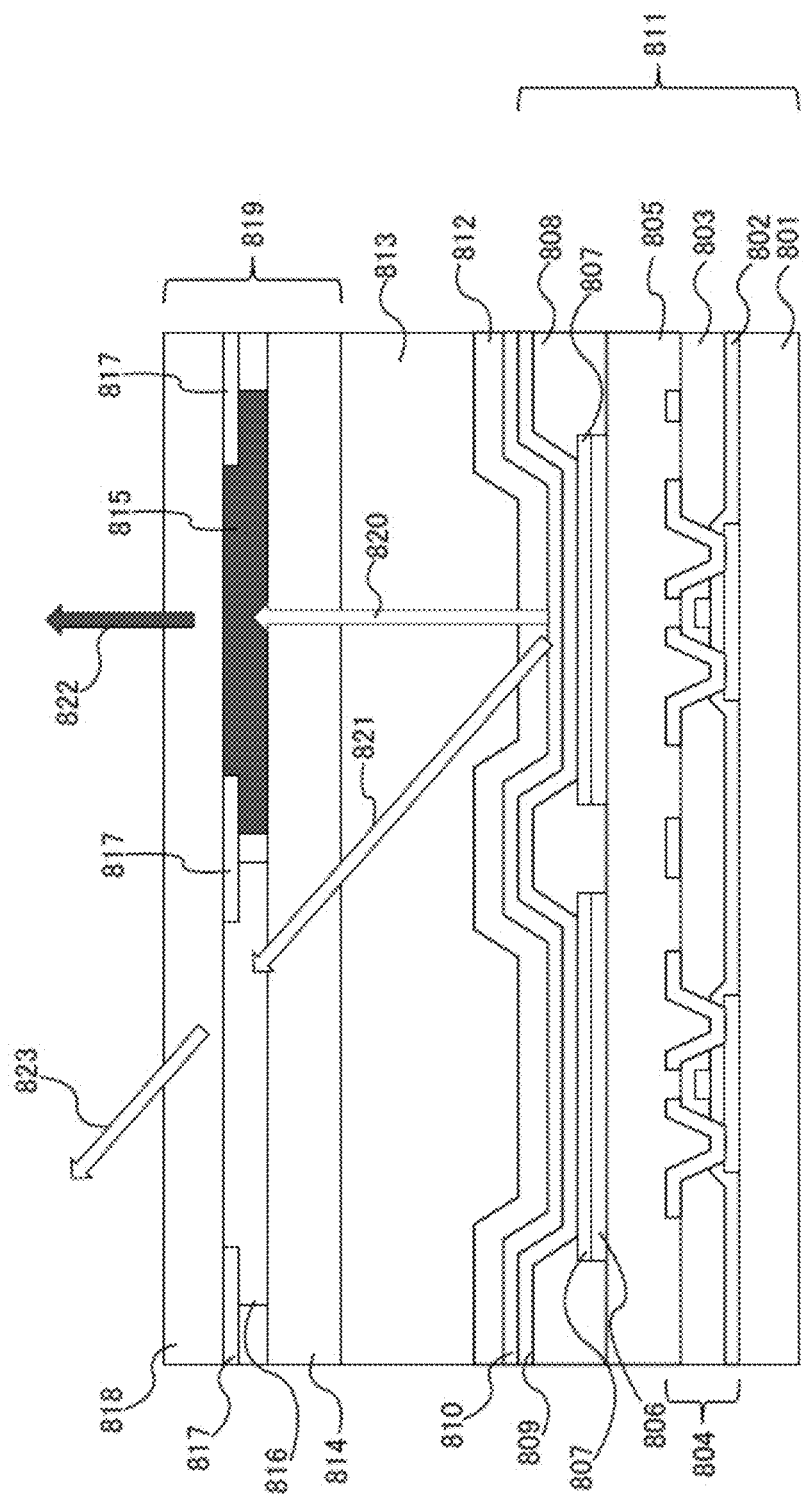

DISPLAY DEVICE

CROSS-REFERENCE TO RELATED APPLICATIONS

This application is based upon and claims the benefit of priority from the prior Japanese Patent Application No. 2014-015941, filed on 30 Jan., 2014, the entire contents of which are incorporated herein by reference.

FIELD

The present invention relates to a display device, and in particular to a technique for construction and arrangement of a sub-pixels.

BACKGROUND

In recent years, in a light emitting display device for mobile purposes, there is a strong demand for high resolution and low power consumption. Display devices which use a liquid crystal display device (LCD) or organic light-emitting diode (OLED) such an organic EL display device or electronic paper etc. are being adopted.

Among these, the development of organic EL display devices is progressing with the aim of achieving small scale display panels, high resolution and high speed. An organic EL display device is arranged with pixels which are formed from an organic light-emitting diode, have high reaction speed since they have no mechanical operations, high luminosity display is possible since each pixel emits light and because a thin display is possible since a backlight is not required, the next generation of display devices is expected.

In an OLED display panel in which a color filter is combined with an organic light-emitting diode which emits white light, one pixel (main pixel) is formed from sub-pixels which include a plurality of colors and a display region is formed by arranging these pixels. As high definition of OLED display panels progresses, when the display panel is seen from a diagonal direction, a problem occurs whereby different colors of a sub-pixel adjacent to a regular color of a sub-pixel become mixed. In order to prevent mixed colors, it is effective to increase the width of a black matrix which is a light shielding film between pixels. However, an increase in the width of a black matrix invites a drop in aperture ratio, a decrease in display quality and because this leads to a deterioration in power consumption, there is a limit to dealing with the problem of mixed colors using a black matrix.

However, in each type of display device, from the viewpoint of intermediate display quality and ease of manufacture related to a sub-pixel of a pixel which forms a display screen, a shape and structure of various types of sub-pixels has been proposed (for example, patent document 1 [Japanese Laid Open patent 2007-227274], patent document 2 [Japanese Laid Open Patent 2009-533810]).

The present invention provides a display device which reduces the effects of mixed colors.

SUMMARY

According to one embodiment of the present invention, a display device is provided including a display region arranged with a plurality of main pixels formed from a group including a red pixel, green pixel, blue pixel and white pixel wherein the main pixel includes an arrangement in which the white pixel is adjacent to a pixel other than the blue pixel, and the display region is arranged so that white pixels in each of the main pixels are mutually adjacent.

Furthermore, as another preferred aspect of the present invention, a display device is provided wherein the white pixel is adjacent to the green pixel in the main pixel Furthermore, as another preferred aspect of the present invention, a display device is provided wherein the blue pixel is adjacent to the red pixel in the main pixel.

Furthermore, as another preferred aspect of the present invention, a display device is provided wherein the display region is arranged so that the blue pixels in each of the main pixels are mutually adjacent.

Furthermore, as another preferred aspect of the present invention, a display device is provided wherein the main pixel is a square shape, and the red pixel, the green pixel, the blue pixel and the white pixel are differentiated by a diagonal line of the main pixel and two lines roughly parallel to the diagonal line.

Furthermore, as another preferred aspect of the present invention, a display device is provided wherein the main pixel is a square shape, the white pixel has a square shape sharing one corner of the main pixel and a part of two sides adjacent to that corner, the green pixel has an L character shape adjacent to the white pixel, the red pixel has an L character shape adjacent to the green pixel, and the blue pixel has an L character shape adjacent to the red pixel.

Furthermore, as another preferred aspect of the present invention, a display device is provided wherein the red pixel, the green pixel, the blue pixel and the white pixel are differentiated by three arcs with the vicinity of the same corner of the main pixel at the center.

According to one embodiment of the present invention, a display device is provided including a pixel electrode electrically connected with a pixel transistor in a contact part, and a main pixel including four square sub-pixels separated by lattice shaped wiring, wherein each of the pixel electrodes is arranged symmetrically within the main pixel and at least one sub-pixel is arranged adjacent to only one sub-pixel.

BRIEF DESCRIPTION OF THE DRAWINGS

FIG. 4B is a schematic diagram showing an arrangement of a sub-pixel of a display device in a first embodiment of the present invention;

FIG. 9 is a cross-sectional diagram of an OLED panel.

DESCRIPTION OF EMBODIMENTS

Figure 1A:
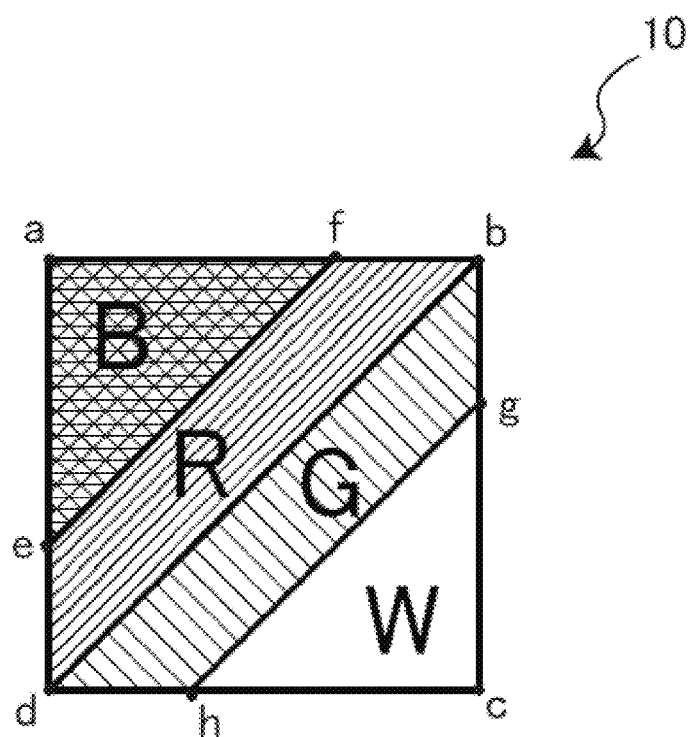
FIG. 1A is a schematic diagram showing an arrangement of a sub-pixel of a display device in a first embodiment of the present invention.

Each embodiment of the present invention is explained below while referring to the drawings. Furthermore, the disclosure is merely one example and various modifications which conform with the premise of the invention and which could be easily conceived of by person ordinarily skilled in the art are included within the scope of the present invention. In addition, in order to further clarify explanation, the drawings may be expressed schematically with respect to the width, thickness and shape of each part compared to actual appearance and are only examples and do not limit the interpretation of the present invention. In addition, in the specification and each drawing the same reference symbols are attached to the same elements that have previously been described or already exist in previous drawings

[Circumstances Leading to the Present Invention]

Figure 8A:
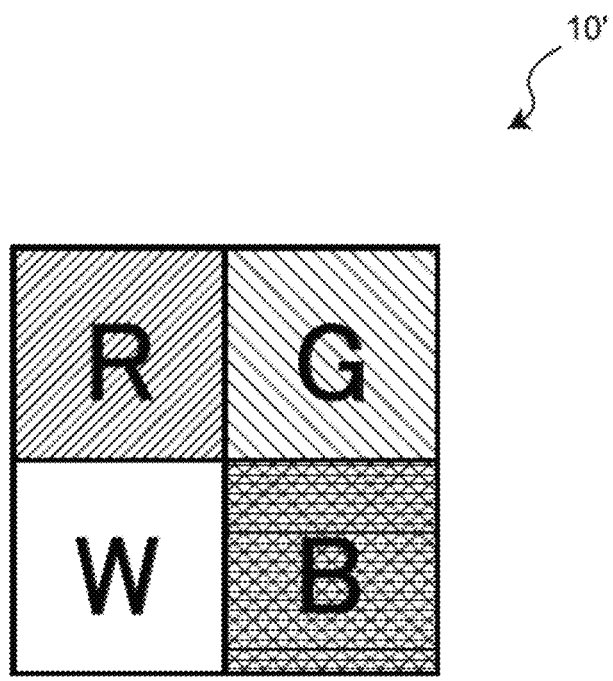
FIG. 8A is a schematic diagram showing an arrangement of a sub-pixel in a conventional display device.

FIG. 8A shows a pixel structure in a conventional technology. One pixel is formed from four sub-pixels, red (R), green (G), blue (B) and white (W). The sub-pixel R, sub-pixel G, sub-pixel B and sub-pixel W have the same square shape. As is shown in FIG. 8, the sub-pixel R is arranged in the upper left, the sub-pixel G is arranged in the upper right, the sub-pixel B is arranged in the lower right and the sub-pixel W is arranged in the lower left and the four sub-pixels form one square shaped pixel 10'.

Figure 8B:
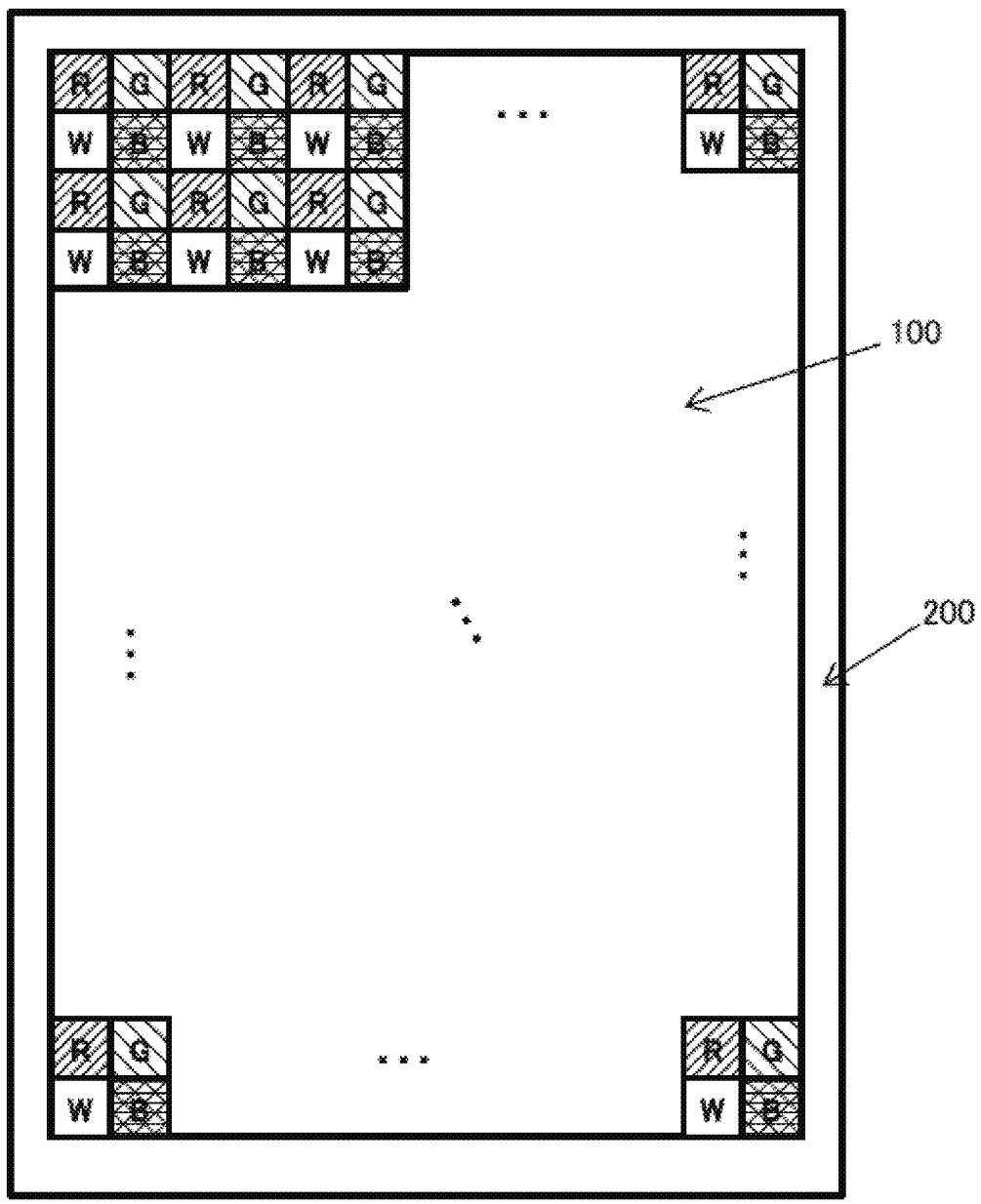
FIG. 8B is a schematic diagram showing an arrangement of a pixel in a conventional display device.

FIG. 8B shows a pixel structure in a conventional technology and shows the state when a pixel is arranged in a display device. The display device includes a display part 100 which displays an image and a frame part 200 on the exterior. The pixels are arranged in a lattice shape and form a display region. Here, the pixels which form the display region are the sub-pixel R in the upper left, the sub-pixel G in the upper right, the sub-pixel B in the lower right and the sub-pixel W in the lower left and all are aligned in the same direction. Therefore, when looking at the arrangement of the sub-pixels within the display region, for example, the highest horizontal line is arranged with R, G, R, G alternating from the left, the second horizontal line from the top is arranged with W, B, W, B alternating from the left. The vertical line furthest left is arranged with R, W, R, W alternating from the top, and the second vertical line from the left is arranged with G, B, G, B alternating from the top.

FIG. 9 is a cross-sectional diagram of an OLED panel and shows a cross-section of a part where a sub-pixel W and sub-pixel B are adjacent. A first interlayer insulation film 802 and a second interlayer insulation film 803 are stacked above a first glass substrate 801 and a pixel circuit 804 is formed from a TFT or capacitor. A planarized film 805, reflection plate 806 and anode 807 are formed above the second interlayer insulation film 803 and pixel circuit 804. A bank 808 is formed between anodes 807 and an EL layer 809 and cathode 810 are stacked above the anode 807 and bank 808. A LTPS substrate 811 formed using a cathode 812 from the glass substrate 801 is formed with a sealing film 812, is bonded so as to maintain a certain distance with a CF substrate 819, and a FILL material 813 comprised from a transparent resin etc is filled between the LTPS substrate 811 and CF substrate 819. The CF substrate 819 is formed with a color filter and black matrix 817 in a second glass substrate 818, and further formed with an OC 814. In a conventional structure, a blue color filter is used as a first color filter 815 and a white color filter is used as a second color filter 816. Furthermore, in the OLED panel structure described above, the structure is used in the present invention apart from the components related to a sub-pixel shape arrangement. That is, in the present invention, among adjacent first color filters 815 and second color filters 816, in the case where blue in which color change can be easily recognized is used for one of the color filters, white or green which has a high luminosity is not used for the color filter.

The pixel circuit 804 controls the amount of current which flows to the EL layer 809 between the anode 807 and cathode 810 and the EL layer 809 emits layer according to that current. In an organic EL display device which uses a color filter as shown in FIG. 9, the EL layer 809 usually emits white light. 820 and 821 are images of the EL layer 809 emitting light. The light 820 which runs in a perpendicular direction enters the blue color filer arranged above the anode 807. The light 820 which passes through the blue color filter is displayed as blue light 822. In this way, the anode electrode 807 arranged under the blue color filter is controlled to intentionally emit blue color light.

The EL layer 809 emits light not only towards the color filter arranged directly above but in all directions. The light 821 is sometimes emitted in an upward diagonal direction toward an adjacent white color filter. At this time, the light 821 passes through a white color filter and is display as white color light 823. Mixed colors is produced when light emitted from a light emitting element (pixel) passes through not only a regular filter directly above (a filter intended to emit a color) but also from an adjacent different color filter. In FIG. 9, an adjacent W is mixed with respect to B which is a regular color.

Chromaticity is a characteristic of color in which hue and purity of color are combined, and the distance on the chromaticity diagram and the level of color change which can actually be perceived by a human are different depending on the color. When R, G, B and W are compared, a change in color of B can be most easily recognized and a change in color in G is the most difficult to recognize (refer to [MacAdam Elipse] which displays identification variation with respect to a specific center color in an XY chromaticity diagram). Again referring to FIG. 8A and FIG. 8B, the sub-pixel R is arranged on the upper left, the sub-pixel B is arranged on the upper right, the sub-pixel G is arranged on the lower right and the sub-pixel W is arranged on the lower left, and although mixed colors is of a sub-pixel W with respect to a sub-pixel B is suppressed because the sides of the sub-pixel B and the sub-pixel W do not contact, mixed colors of the sub-pixel G cannot be suppressed since the sub-pixel B contacts the sub-pixel G which has high luminosity the same the sub-pixel W. Even if the arrangement of each pixel is changed, the sub-pixel B contacts either the sub-pixel W or sub-pixel G or both of them.

The inventors of the present application were aware of the problem of wishing to avoid the mixed colors with respect to B which easily is affected by mixed colors and the problem of a decrease in display quality due to mixed colors. In particular, they were also aware of the problem of trying to avoid mixed colors of W or G which have a high luminosity (luminosity sense) with B. Furthermore, the inventors of the present application considered that mixed colors with respect to G in which a change in color is difficult to recognize is comparatively allowable and in order to avoid the effects of mixed colors as much as possible, if the mixed color is R which has a low luminosity then the effects of mixed colors can be comparatively reduced. Considering the awareness of the problems and ideas described above, the inventors of the present application invented a display device which can suppress the effects of mixed colors in the embodiments described herein. Specific embodiments are described below.

First Embodiment

FIG. 1A is a schematic diagram showing the shape and structure of a sub-pixel of a display device in a first embodiment of the present invention. A pixel 10 has a square shape formed from peaks a, b, c, d. The pixel 10 is sectioned into four by three lines, the symmetrical diagonal line bd, the line of which joins the point e on the side ad and the point f on the side ab, and the line hg which joins the point h on the side dc and the point g on the side bc. The blue sub-pixel B is formed in a region enclosed by the points afe, the red sub-pixel R is arranged in a region enclosed by the points edbf, the green sub-pixel G is arranged in a region enclosed by the points dbgh and the white sub-pixel W is arranged in a region enclosed by the points hgc. The pixel 10 is formed by the sub-pixel R, the sub-pixel G, the sub-pixel B and the sub-pixel W.

Furthermore, in FIG. 1A and the diagrams in the rest of the present specification, although each sub-pixel is depicted as contacting each other without any gaps, a gap may be formed in order to arrange a black matrix between each sub-pixel. In addition, as long as no specific explanation is required, [sub-pixels are adjacent] and [sub-pixels contact] in the present specification refer to a state in which one sub-pixel is adjacent to another sub-pixel with a black matrix in between.

Figure 1B:
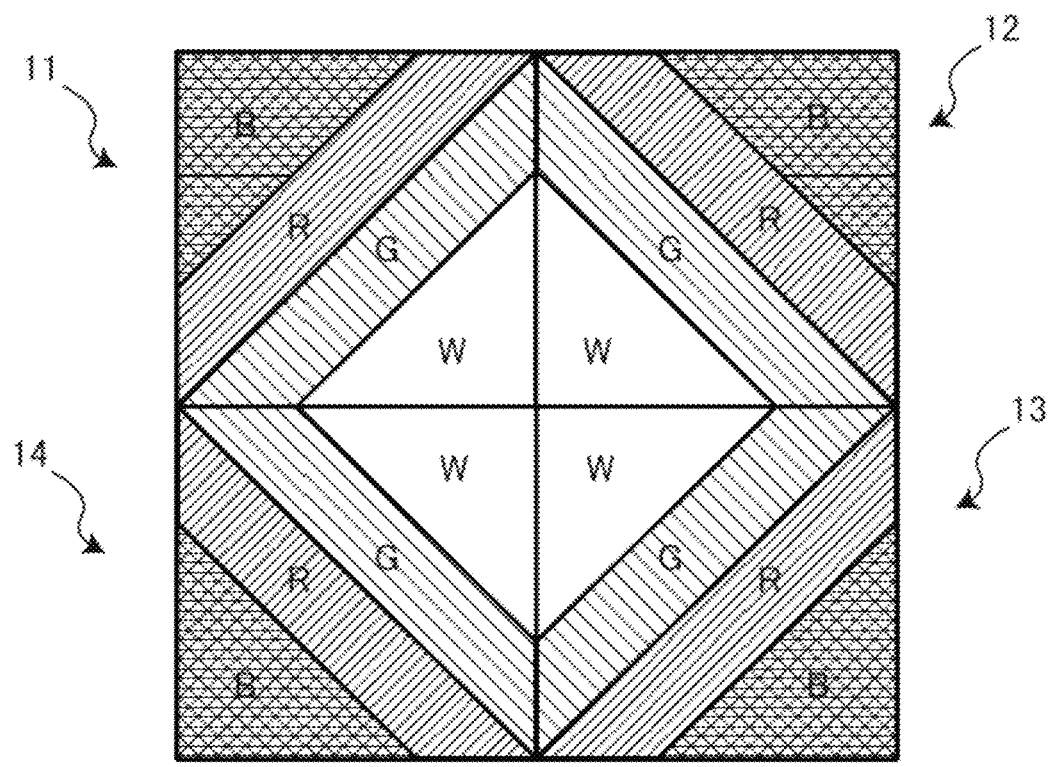
FIG. 1B is a schematic diagram showing an arrangement of a pixel of a display device in a first embodiment of the present invention.

FIG. 1B is a schematic diagram showing an arrangement of a pixel in the display device in the first embodiment of the present invention. Four pixels pixel 11, pixel 12, pixel 13 and pixel 14 are arranged in FIG. 1B. Each of the pixels is formed by and arranged with sub-pixels R, G, B and W the same as pixel 10 shown in FIG. 1A. Referring to FIG. 1A and FIG. 1B together, the pixel 11 is arranged in the same direction as the pixel 10. The pixel 12 is arranged in a state in which the pixel 10 is rotated 90 degrees to the right with the peak c of the pixel 10 at the center. Pixel 13 is arranged in a state in which the pixel 10 is rotated 180 degrees with the peak c of the pixel 10 at the center. Pixel 14 is arranged in a state in which the pixel 10 is rotated 270 degrees with the peak c of the pixel 10 at the center.

Figure 1C:
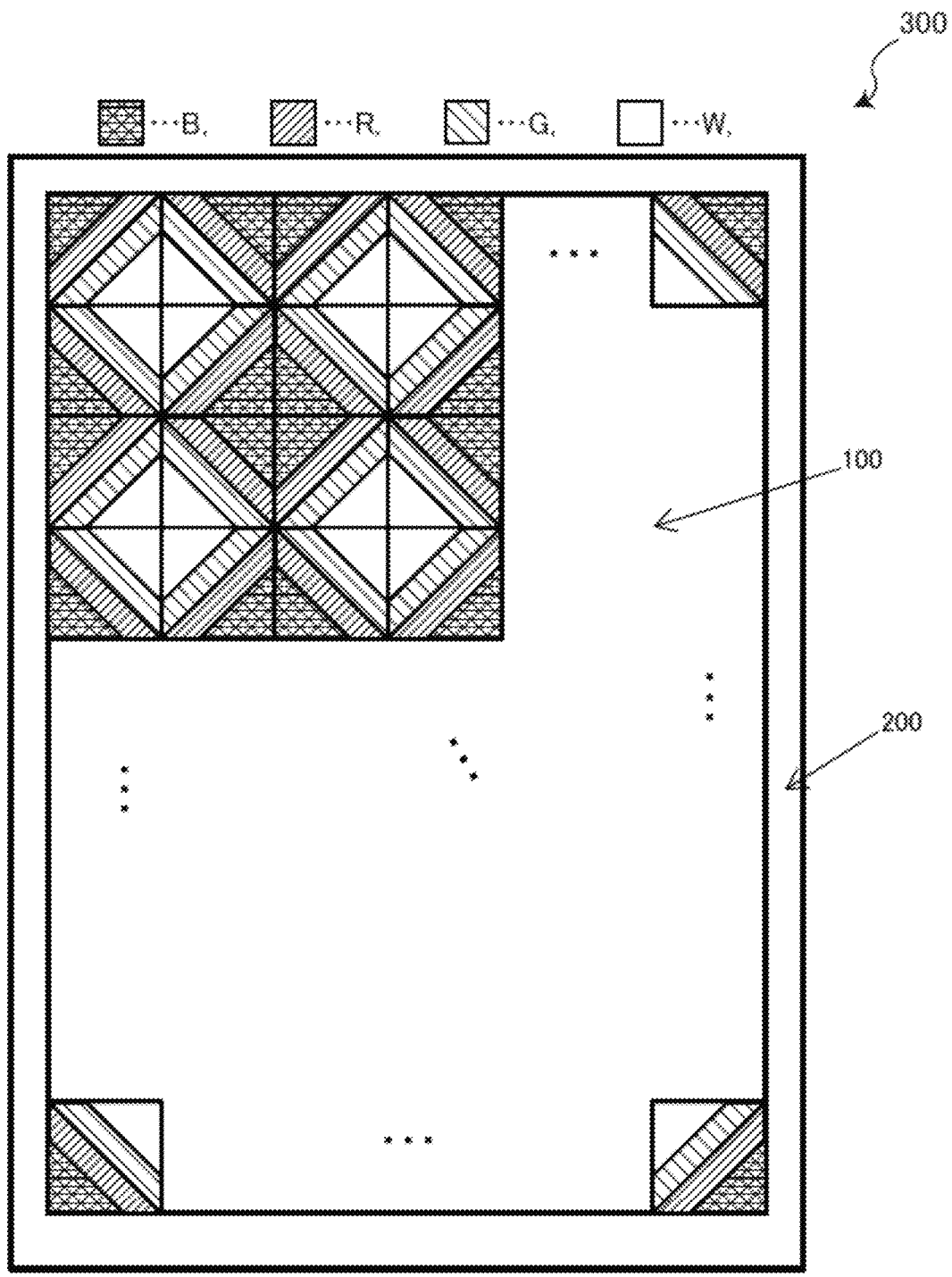
FIG. 1C is a schematic diagram showing an arrangement of a pixel of a display device in a first embodiment of the present invention.

FIG. 1C is a schematic diagram showing an arrangement of a pixel of the display device in the first embodiment of the present invention. The display device 300 includes a display region 100 which display an image, and a narrow frame 200 which extends from the outer side of the display region 100 to the outer edge of the display device 300. Pixels are arranged in sequence in the display region 100 while maintaining the regularity of the pixel arrangement shown in FIG. 1B.

It can be seen that the sub-pixel B is adjacent to the sub-pixel R or the sub-pixel B which forms another pixel. As described above, because it a change in color of B is the easiest to recognize among R, G, B and W, from the viewpoint of mixed colors, the sub-pixel B is the most easily affected by mixed colors. In addition, since R has the lowest luminosity among R, G, B, from the viewpoint of mixed colors, the sub-pixel R has a small effect on other colors. Therefore, in the first embodiment, since a structure is adopted in which the sub-pixel B which is the most easily affected from the view point of mixed colors is enclosed by the sub-pixel R which has a small effect on other colors, it is possible to suppress mixed colors with respect to the sub-pixel B.

In addition, it can be seen that sub-pixel which is adjacent to the sub-pixel W is a sub-pixel G or sub-pixel W which forms another pixel. As described above, because W has the highest luminosity among R, G, B and W, from the viewpoint of mixed colors, the sub-pixel W provides the worst effects. In addition, since a change in color of G is the most difficult to recognize among R, G, B and W, from the view point of mixed colors, it is difficult for the sub-pixel G to be affected. Therefore, in the first embodiment, by adopting a structure in which a sub-pixel W which provides the worst effects from the view point of mixed colors is enclosed by a sub-pixel G which is not affected easily, it is possible to suppress mixed colors caused by the sub-pixel W.

Modified Example 1 of First Embodiment

In FIG. 1A, although the pixel 10 is exemplified as a square formed by peaks a, b, c, d, in the embodiments of the present invention, the shape of a pixel is not limited to a square. In addition, although the line bd is arranged to match a symmetrical diagonal line and the lines of and hg are arranged parallel to the line bd, in the embodiments of the present invention, the lines which define the interface of these sub-pixels are not mutually limited to being completely parallel. Furthermore, lines which define the interface of each sub-pixel are not required to be straight lines.

Figure 2A:
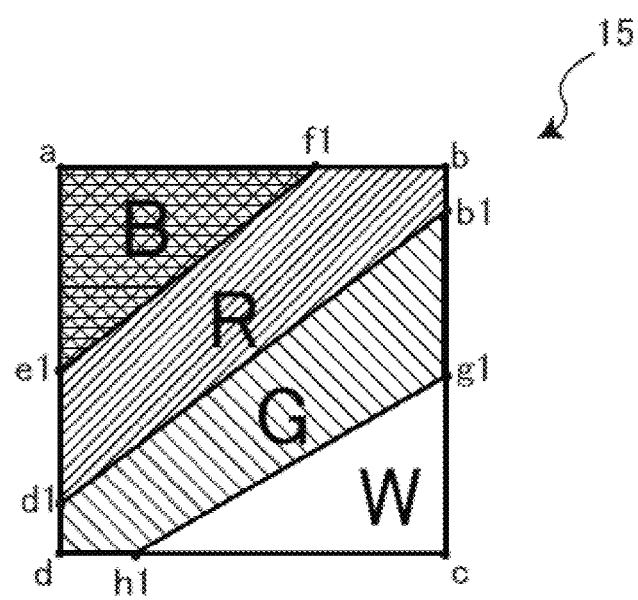
FIG. 2A is a schematic diagram showing an arrangement of a sub-pixel of a display device in a first embodiment of the present invention.

FIG. 2A shows a modified example 1 of a sub-pixel arrangement in the first embodiment. Sub-pixel 15 is different to the sub-pixel 10 in FIG. 1A. The interface line between the sub-pixel R and sub-pixel G is formed not be the symmetrical diagonal line bd but by a line b1$d$1 which joins the point d1 near d on the side ad and the point b1 near the point b on the side bc. In addition, the interface line e1$f$1 of the sub-pixel B and sub-pixel R and the interface line h1$g$1 of the sub-pixel G and sub-pixel W are not completely parallel with the line b1$d$1.

Figure 2B:
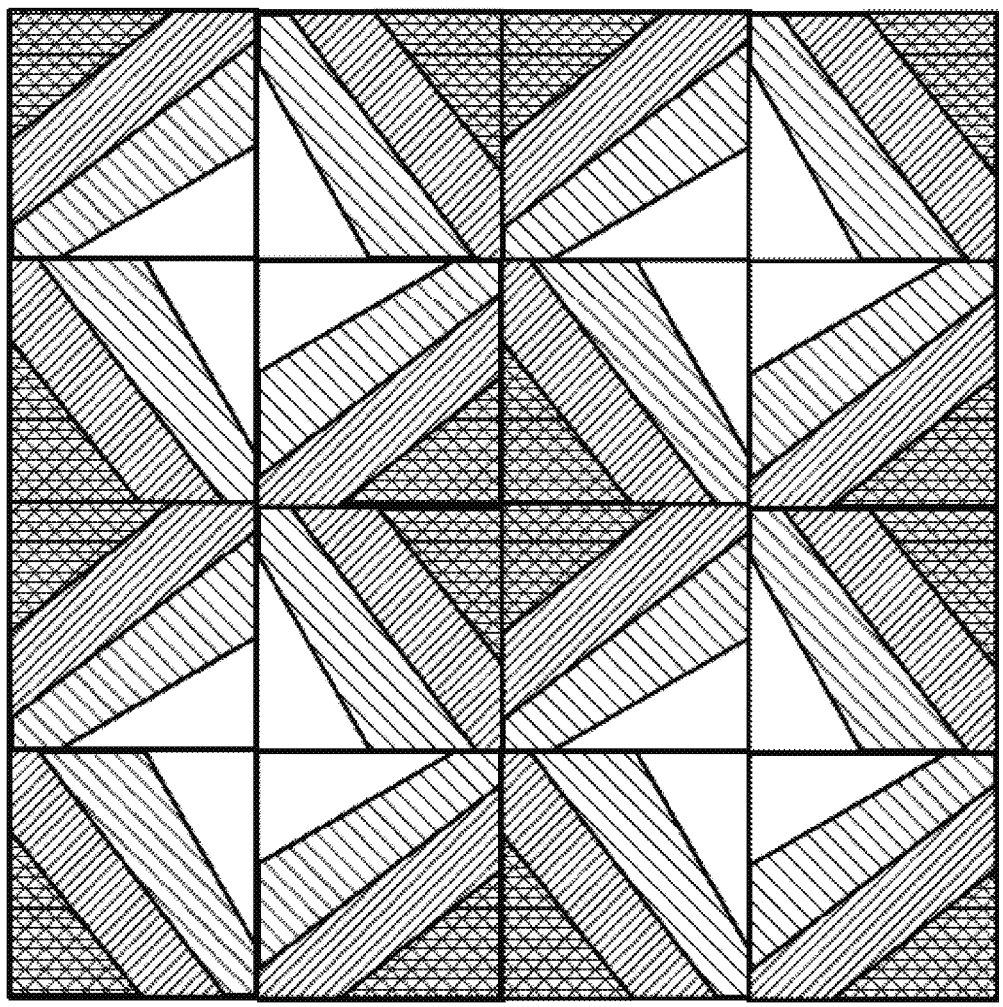
FIG. 2B is a schematic diagram showing an arrangement of a pixel of a display device in a first embodiment of the present invention.

FIG. 2B shows a modified example 1 of the structure of a pixel in the first embodiment. In FIG. 2B, the same as in FIG. 1B and FIG. 1C, the pixel shown in FIG. 1A is arranged with regularity by rotating 90 degrees, 180 degrees and 270 degrees in the same direction with same peak at the center. In FIG. 2B, since the sub-pixel B is enclosed by the sub-pixel R and the sub-pixel W is enclosed by the sub-pixel G, it is possible to suppress the effects of mixed colors the same as the first embodiment.

Modified Example 2 of First Embodiment

Although the pixel 10 in FIG. 1A is arranged so that each area of the sub-pixel R, sub-pixel G, sub-pixel B and sub-pixel W are the same, the embodiments of the present invention are not limited to this.

Figure 3A:
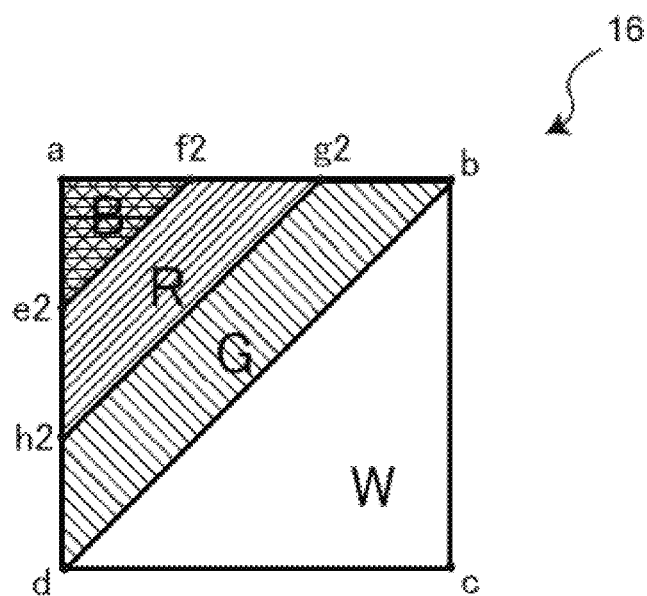
FIG. 3A is a schematic diagram showing an arrangement of a sub-pixel of a display device in a first embodiment of the present invention.

FIG. 3A shows a modified example two of a structure of a sub-pixel in the first embodiment. In FIG. 3A, the range of a sub-pixel is defined by the line bd which joins the points b and d, a line h2g2 which joins the point h2 on the side ad and the point g2 on the side ab, and the line e2f2 which joins the point e2 which is on the side ad and is nearer the peak a then the point h2, and the point f2 which is on the side ab and is nearer the peak then the point g2. In the pixel 16, the area of each pixel becomes wider in the sequence W, G, R, B and the area of each sub-pixel is different.

Figure 3B:
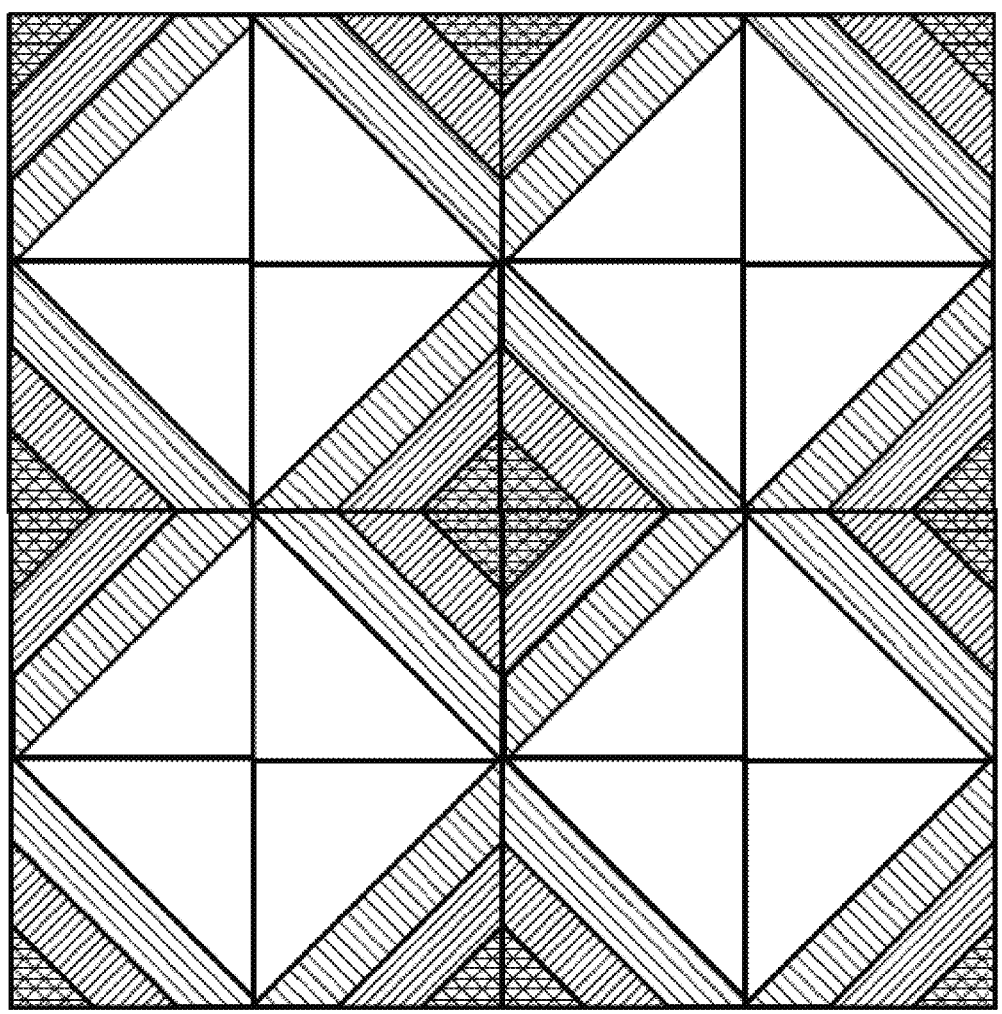
FIG. 3B is a schematic diagram showing an arrangement of a pixel of a display device in a first embodiment of the present invention.

FIG. 3B shows a modified example two of a structure of a pixel in the first embodiment. In FIG. 3B, the pixel 16 shown in FIG. 3A is regularly arranged while changing the direction the same as in FIG. 1B and FIG. 1C. In FIG. 3B, since the sub-pixel B is enclosed by the sub-pixel R and the sub-pixel W is enclosed by the sub-pixel G, it is possible to suppress the effects of mixed colors the same as the first embodiment.

Second Embodiment

Figure 4A:
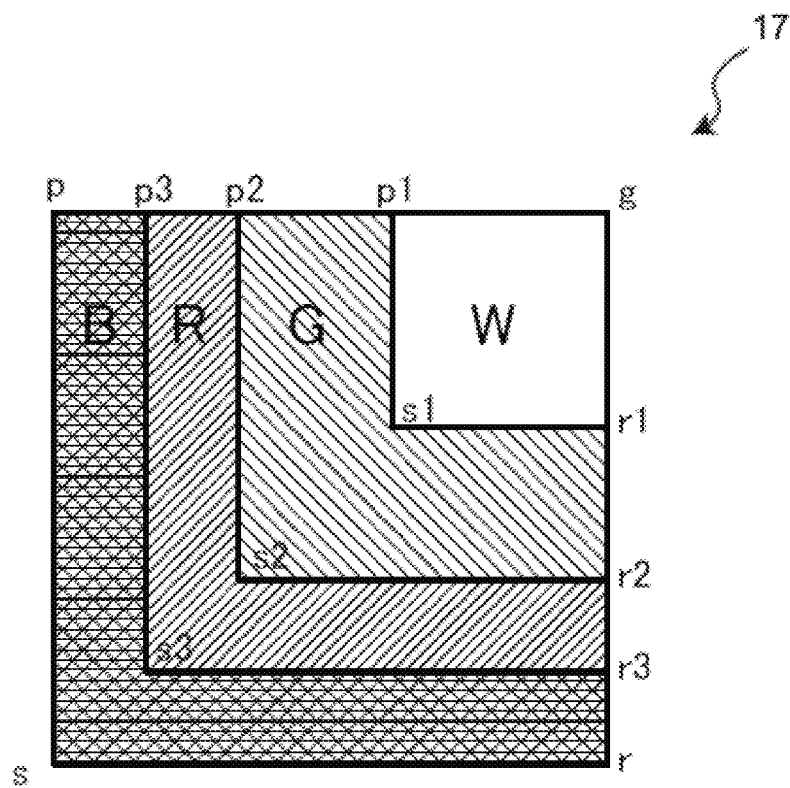
FIG. 4A is a schematic diagram showing an arrangement of a sub-pixel of a display device in a second embodiment of the present invention.

FIG. 4A shows the shape and structure of a sub-pixel of a display device in a second embodiment of the present invention. A pixel 17 has a square shape formed from peaks p, q, r, s. A square shaped sub-pixel W formed with points p1, q, r1, s1 at the peak on the upper right of pixel 17. Here, point p1 is a point on the side pq of pixel 17 and point r1 is on the side qr. In addition, the point s1 is located on the symmetrical diagonal line qs of pixel 17.

An L shaped sub-pixel G is arranged so as to contact with the left side and bottom side of the sub-pixel W. p2 is a point on the side pq, r2 is a point on the side qr, and s2 is a point located on the symmetrical diagonal line qs. The sub-pixel g is arranged in a region formed by joining the points p2, p1, s1, r1, r2, s2, p2 in lines in sequence.

The sub-pixel R is arranged to contact the L shaped sub-pixel G and the sub-pixel B is arranged to contact the sub-pixel R. Here, p3 is a point on the side pq, r3 is a point on the side qr, and s3 is a point located on the symmetrical diagonal line qs. The sub-pixel R is arranged in a region formed by joining the points p3, p2, s2, r2, r3, s3, p3 in lines in sequence. In addition, the sub-pixel B is arranged in a region formed by joining the points p, p3, s3, r3, r, s, p in lines in sequence.

FIG. 4B is a schematic diagram showing the arrangement of a pixel in the display device in the second embodiment of the present invention. In the second embodiment, the same as in the first embodiment, the pixel 17 is formed by four pixels by rotating 90 degrees, 180 degrees and 270 degrees in the same direction and arranged with regularity in the display region 100.

Referring to FIG. 4B, since the sub-pixel B only contacts the sub-pixel R (and sub-pixel B which forms another pixel) and the sub-pixel W is enclosed by the sub-pixel G, it is possible to suppress the effects of mixed colors the same as the first embodiment.

Modified Example of Second Embodiment

In FIG. 4A, although the shape formed with the points p1, q, r1, s1 as peaks, the shape formed with the points p2, q, r2, s2 as peaks, the shape formed with the points p3, q, r3, s3 as peaks, and the shape formed with the points p, q, r, s as peaks are each shown as a square shape, the present invention is not limited to these embodiments.

Figure 5A:
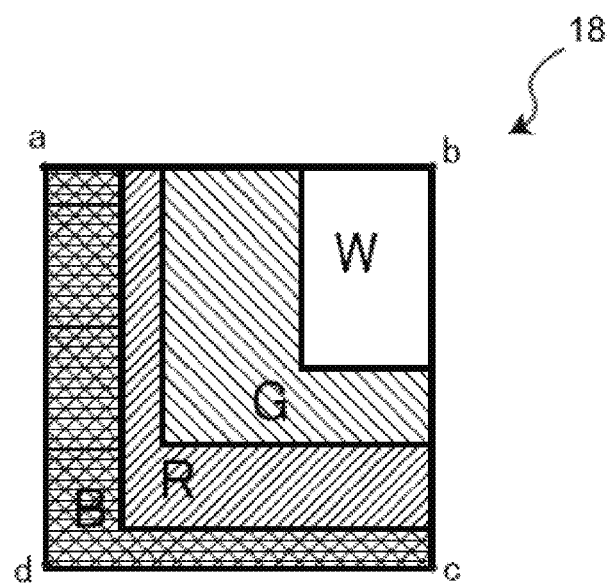
FIG. 5A is a schematic diagram showing an arrangement of a sub-pixel of a display device in a first embodiment of the present invention.
Figure 5B:
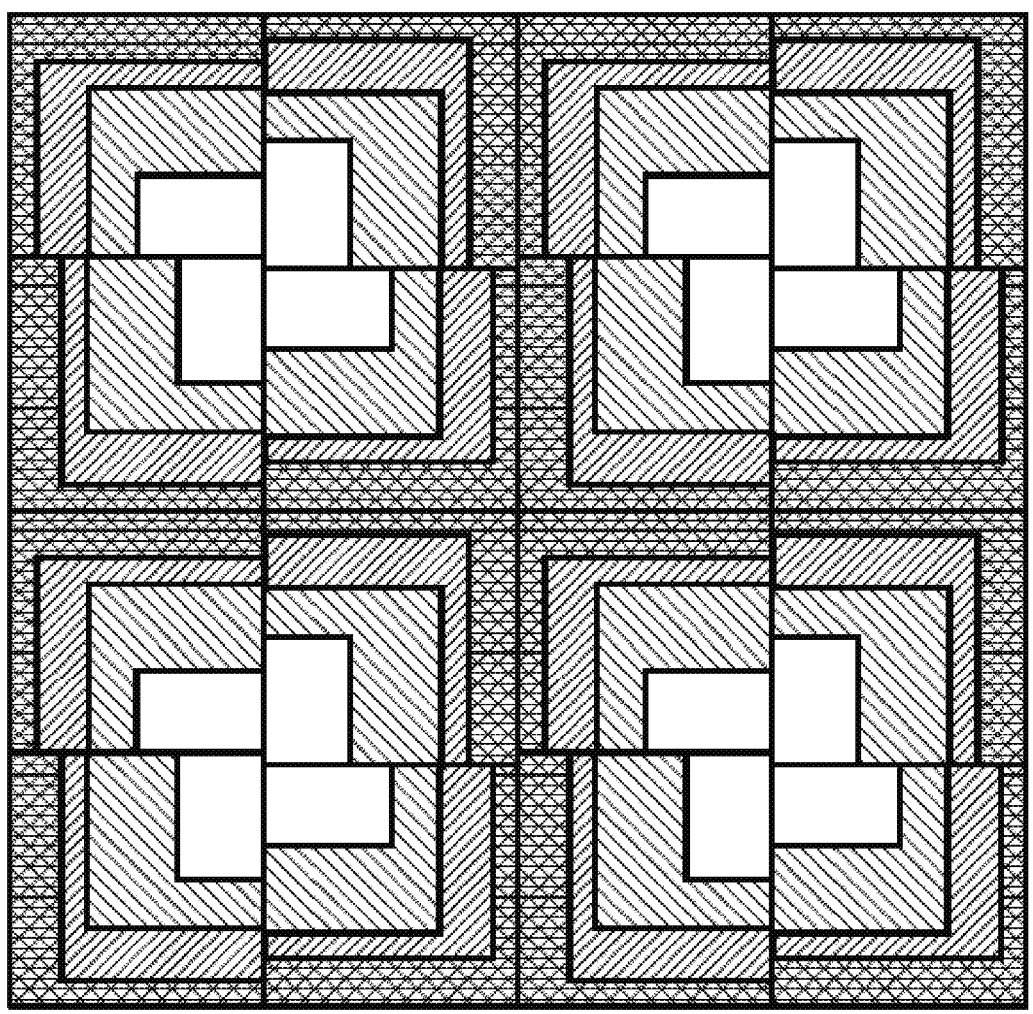
FIG. 5B is a schematic diagram showing an arrangement of a pixel of a display device in a second embodiment of the present invention.

FIG. 5A shows a modified example of the structure of a pixel in the second embodiment. Here, each sub-pixel which forms pixel 18 is defined by an L shaped line. However, the sub-pixel W is not a square shape and the L shaped sub-pixels G, R and B have different widths on either side of the L shape. However, as is shown in FIG. 5B, it is possible to arrange the sub-pixel B to contact only the sub-pixel R and the sub-pixel W to be enclosed by the sub-pixel G and adjust the shape of each sub-pixel appropriately.

Third Embodiment

Figure 6A:
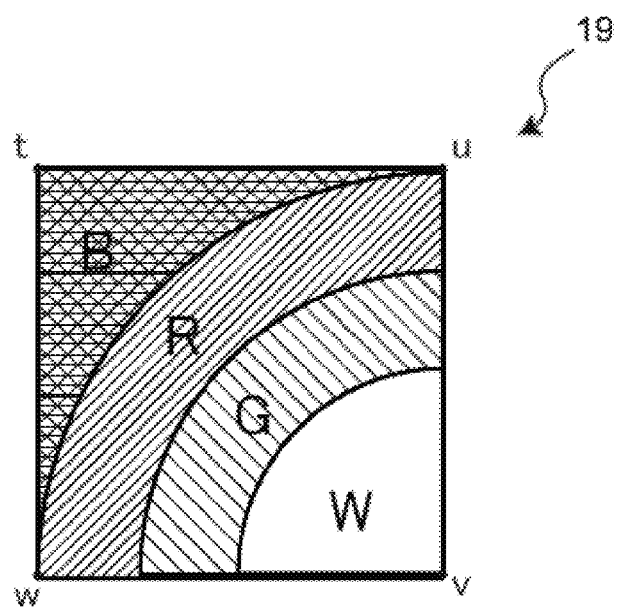
FIG. 6A is a schematic diagram showing an arrangement of a sub-pixel of a display device in a third embodiment of the present invention.
Figure 6B:
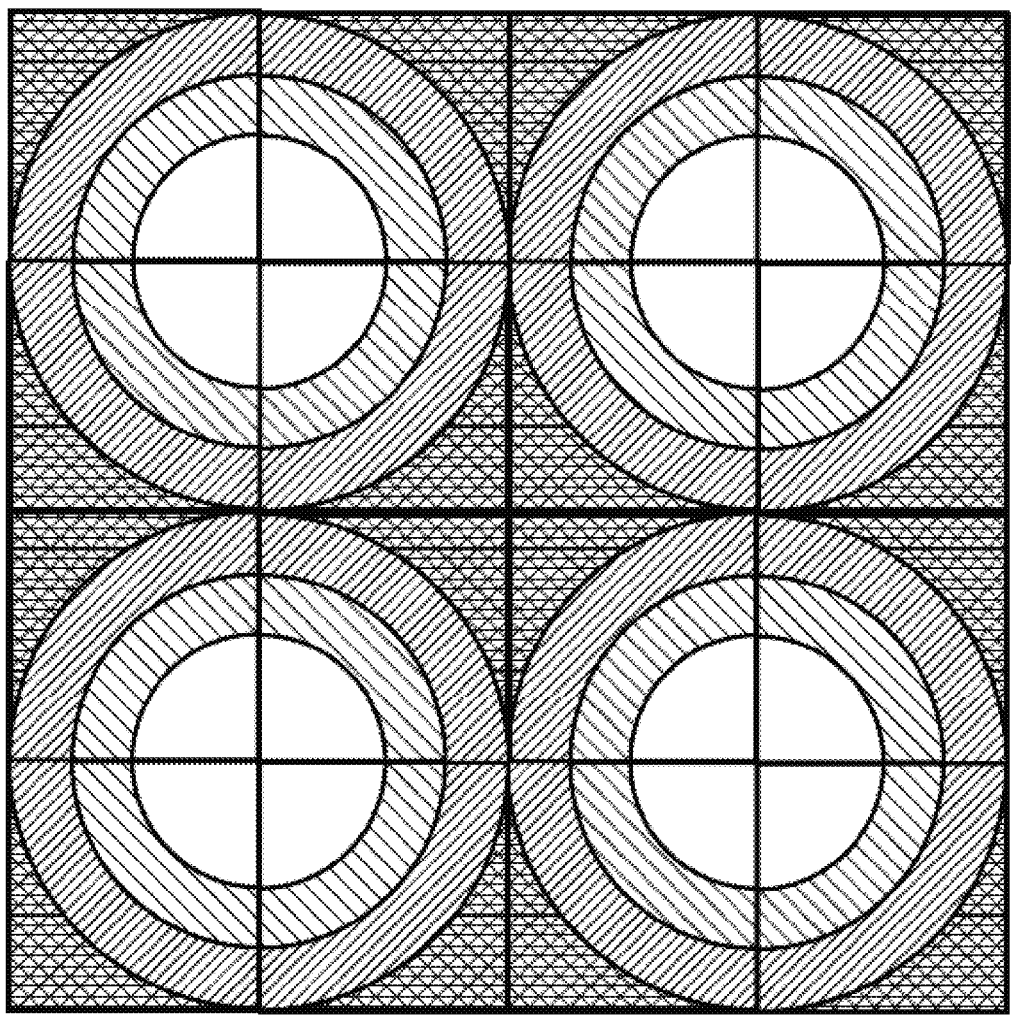
FIG. 6B is a schematic diagram showing an arrangement of a pixel of a display device in a first embodiment of the present invention.

FIG. 6A is a schematic diagram showing the shape and structure of a sub-pixel in a display device in a third embodiment of the present invention. Pixel 19 has a square shape formed from peaks t, u, v, w and sub-pixels are defined by three concentric circles with the point v at the center. The sub-pixel W, the sub-pixel G, the sub-pixel R and the sub-pixel B are arranged in sequence nearest to the point v FIG. 6B is a schematic diagram showing the arrangement of a pixel in the display device in the third embodiment of the present invention. In the third embodiment, the same as in the first embodiment, the pixel 19 is formed by four pixels by rotating 90 degrees, 180 degrees and 270 degrees in the same direction and arranged with regularity in the display region 100.

Referring to FIG. 6B, since the sub-pixel B only contacts the sub-pixel R (and sub-pixel B which forms another pixel) and the sub-pixel W is enclosed by the sub-pixel G, it is possible to suppress the effects of mixed colors the same as the first embodiment.

Modified Example of Third Embodiment

In the third embodiment, the same as in the modified examples of the first and second embodiments, even if the center of the circle which defines a sub-pixel is slightly misaligned and there is a difference in the area of the sub-pixels, it is possible to demonstrate the effects in the present invention. In addition, even if the arrangement sequence of the colors of the sub-pixels is changed, it is possible to demonstrate the same effects. For example, even if the sub-pixel B, the sub-pixel R, the sub-pixel G and the sub-pixel W are arranged in sequence nearest to the point v in FIG. 6A, because the sub-pixel B is enclosed by the sub-pixel R and the sub-pixel W only contacts the sub-pixel G, it is possible to suppress the effects of mixed colors.

<Circuit Structure>

Figure 7A:
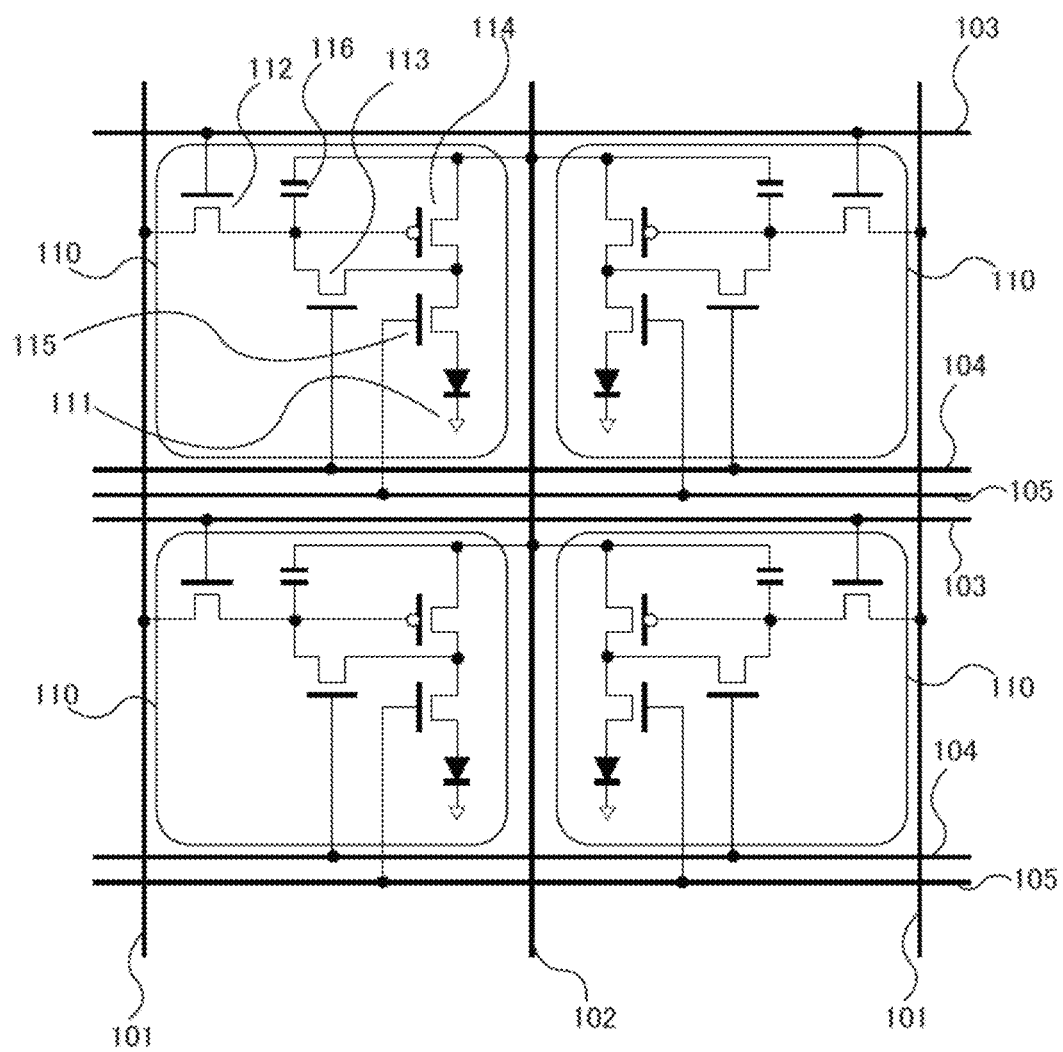
FIG. 7A is a diagram showing a circuit structure of a pixel of a display device in a first embodiment of the present invention.

A specific circuit structure is explained below while referring to FIG. 7A to FIG. 7D. FIG. 7A shows a circuit structure of a pixel part of display device in the first embodiment of the present invention. In FIG. 7A, a scanning wire 103, a first control wire 104 and second control wire 105 are arranged in a horizontal direction and a signal wire 101 and power supply wire 102 are arranged in a vertical direction. Each of these wires is arranged in a lattice shape and four regions are formed by these wires in FIG. 7A, and each wire forms a pixel circuit 110 of each sub-pixel. A TFT 112, 113, 114, 115, a capacitor 116 and organic light emitting diode 111 are included in the pixel circuit 110. The circuit shown in FIG. 7A is one example of a basic pixel circuit and in the present invention, an arbitrary pixel circuit may be formed as long as the shape and arrangement of the sub-pixels are not affected.

Figure 7B:
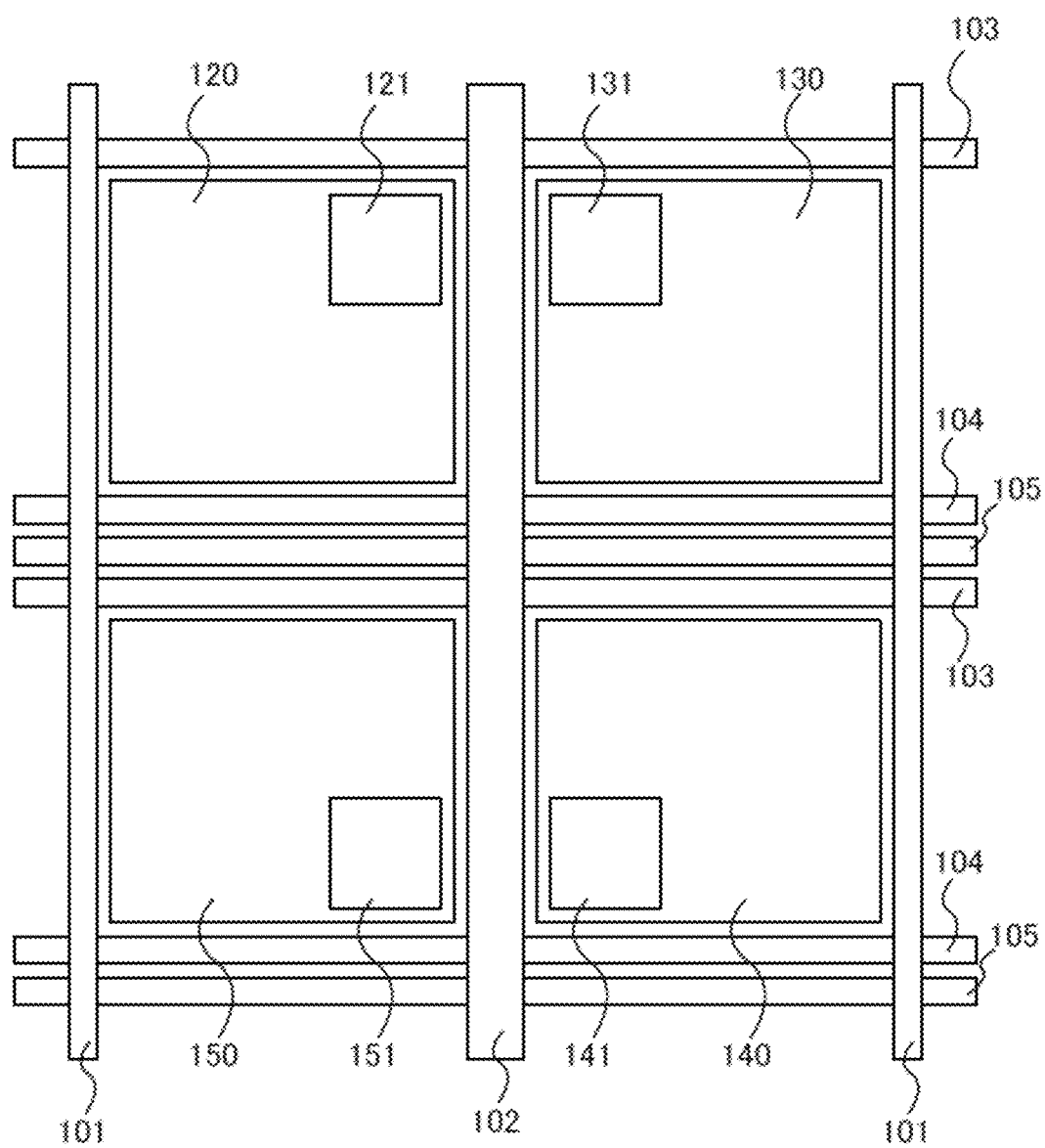
FIG. 7B is a planar perspective diagram showing a pixel part of a display device in a first embodiment of the present invention.

FIG. 7B is a planar perspective view diagram of a pixel part in the display device in the first embodiment of the present invention. A pixel circuit formation region 120 is formed on the upper left, a pixel circuit formation region 130 is formed on the upper right, a pixel circuit formation region 140 is formed on the lower right and a pixel circuit formation region 150 is formed on the lower left by the scanning wire 103, first control wire 104, signal wire 101 and power supply wire 102 formed in a lattice shape. Contact holes 121, 131, 141 and 151 for electrically connecting with a pixel circuit and pixel electrode are formed in each pixel circuit formation region respectively. Here, the contact hole 121 is formed in the upper right of the pixel circuit formation region 120, the contact hole 131 is formed in the upper left of the pixel circuit formation region 130, the contact hole 141 is formed in the lower left of the pixel circuit formation region 140, and the contact hole 151 is formed in the lower right of the pixel circuit formation region 150.

Figure 7C:
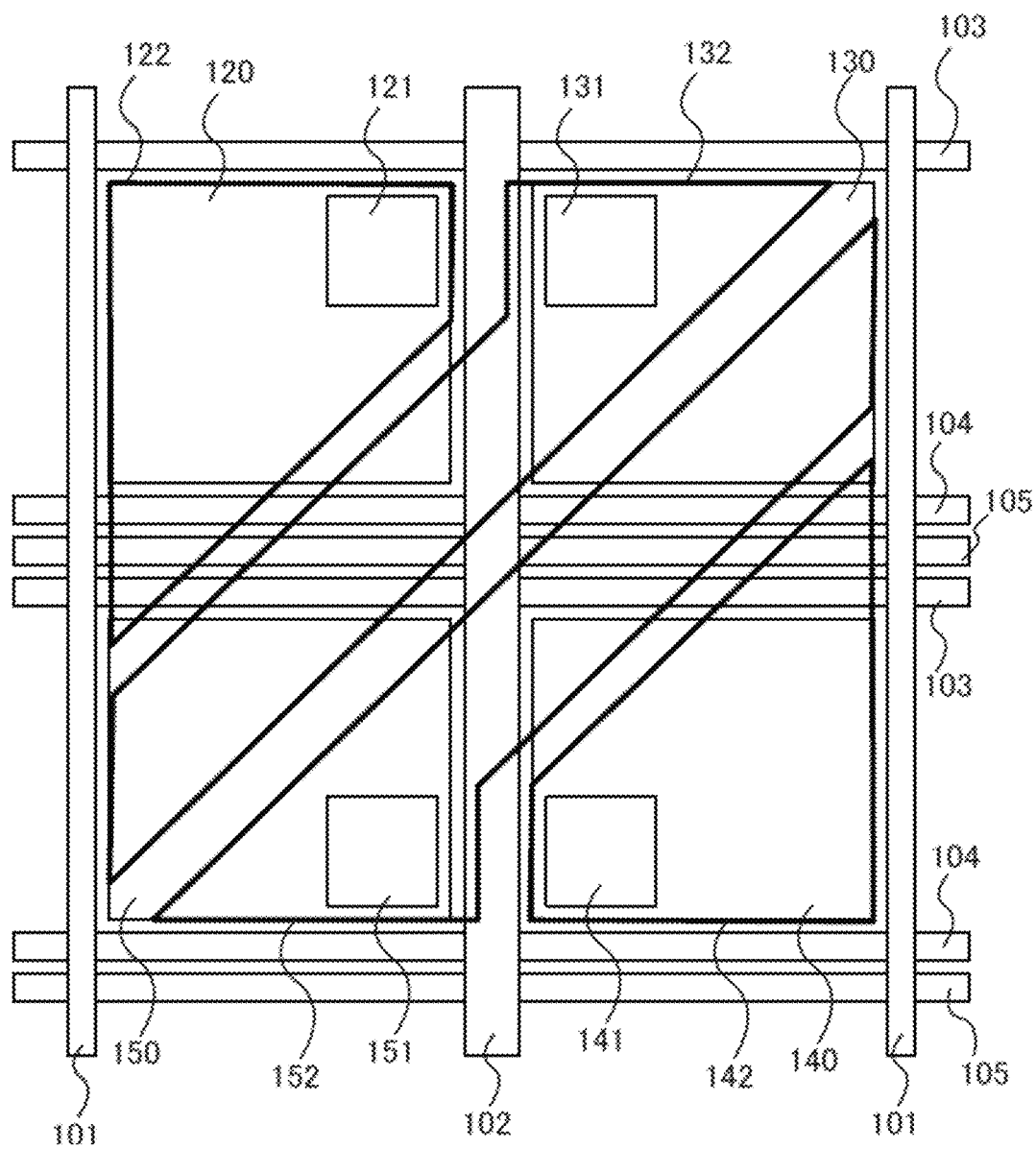
FIG. 7C is a planar perspective diagram showing a pixel part of a display device in a first embodiment of the present invention.

FIG. 7C is a planar perspective view diagram of a pixel part in the display device in the first embodiment of the present invention and shows a state where a pixel overlapped in FIG. 7B. The pixel electrode 122 electrically connected to a circuit of the pixel circuit formation region 120 via the contact hole 121 is defined by a line which passes around the upper side and right side of the contact hole 121 from near the upper left of the pixel circuit formation region 120, passes near the upper left of the pixel circuit formation region 150 and again returns to near the upper left of the pixel circuit formation region 120. The pixel electrode 132 electrically connected to a circuit of the pixel circuit formation region 130 via the contact hole 131 is defined by a line which runs to the lower left of the pixel circuit formation region 150 from the pixel circuit formation region 130, passes near the upper left of the pixel circuit formation region 150, runs as far as the vicinity of the lower left of the contact hole 131, passes the left side and upper side of the contact hole 131 and again returns to the upper right of the pixel circuit formation region 130. The pixel electrode 142 and pixel electrode 152 have a shape which has a point of symmetry with the pixel electrode 122 and pixel electrode 132 with the intersection of the power supply wire 102 and second control wire 105 at the center.

Figure 7D:
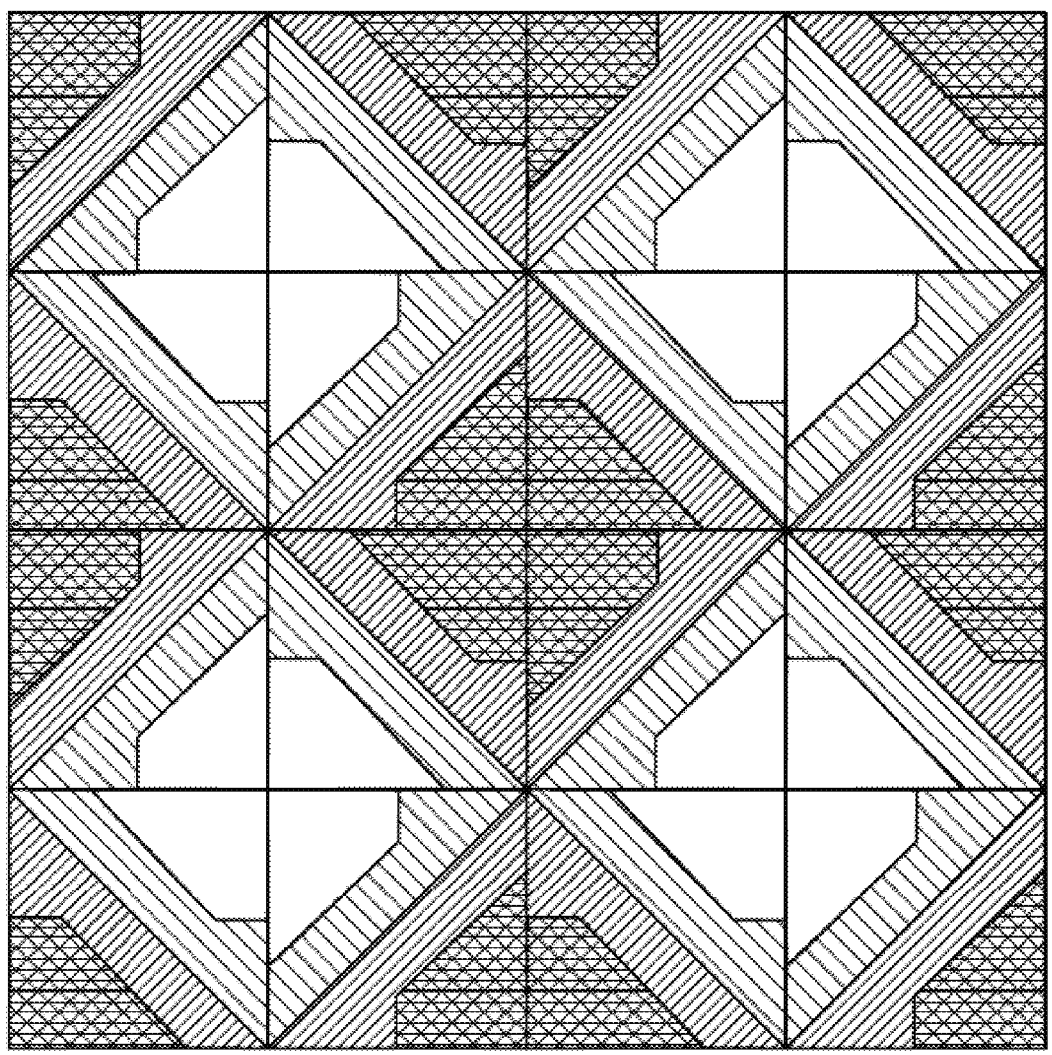
FIG. 7D is a schematic diagram showing one example of a pixel of a display device in a first embodiment of the present invention.

FIG. 7D is a schematic diagram showing an example of an arrangement of a pixel in the display device in the first embodiment of the present invention, and shows a structure in which the pixel electrode 122 corresponds to the sub-pixel B, the pixel electrode 132 corresponds to the sub-pixel R, the pixel electrode 152 corresponds to the sub-pixel G and the pixel electrode 142 corresponds to the sub-pixel W in FIG. 7C. In this case also, because the sub-pixel B is enclosed by the sub-pixel R and the sub-pixel W is enclosed by the sub-pixel G, it can be seen that it is possible to suppress the effects caused by mixed colors.

Although the case of an organic EL display device was shown as an example in the first to sixth embodiments above, a liquid crystal display device or other self-emitting type display device including a light emitting element and color filter or a flat panel type display device such as electronic paper type display device including an electrophoretic element etc may be exemplified. In addition, although the effects of the present embodiment are significant in a small scale display device in particular, it is also possible to apply the present invention to an intermediate to large scale device without particular limits.

Various modifications and corrections are possible to a person ordinarily skilled in the art in the range of the idea of the present invention and it is understood that such modifications and corrections belong to the scope of the present invention. For example, with respect to each embodiment, a person ordinarily skilled in the art may add, remove or change the design of structural elements as appropriate, or add, omit or change the conditions of the processes which are included in the scope of the present invention as long as they do not depart from the scope of the invention.

What is claimed is:

1. A display device comprising:
a display region arranged with a plurality of main pixels, wherein each of the plurality of main pixels includes a red pixel, green pixel, blue pixel and white pixel;
the white pixel of one of the plurality of main pixels is not adjacent to the blue pixels of the plurality of main pixels;
the green pixel of one of the plurality of main pixels is not adjacent to the blue pixels of the plurality of main pixels; and
the white pixels in each of the plurality of main pixels are mutually adjacent.

2. The display device according to claim 1 wherein the white pixel is adjacent to the green pixel in each of the plurality of main pixels.

3. The display device according to claim 2 wherein the blue pixel is adjacent to the red pixel in each of the plurality of main pixels.

4. The display device according to claim 3 wherein the display region is arranged so that the blue pixels in each of the plurality of main pixels are mutually adjacent.

5. The display device according to claim 4 wherein each of the plurality of main pixels is a square shape, and the red pixel, the green pixel, the blue pixel and the white pixel are differentiated by a diagonal line of each of the plurality of the main pixels and two lines roughly parallel to the diagonal line.

6. The display device according to claim 4 wherein each of the plurality of main pixels is a square shape,
the white pixel has a square shape sharing one corner of each of the plurality of main pixels and a part of two sides adjacent to that corner;
the green pixel has an L character shape adjacent to the white pixel;
the red pixel has an L character shape adjacent to the green pixel; and
the blue pixel has an L character shape adjacent to the red pixel.

7. The display device according to claim 4 wherein the red pixel, the green pixel, the blue pixel and the white pixel are differentiated by three arcs with the vicinity of the same corner of each of the plurality of main pixels at the center.

8. A display device comprising:
a display region arranged with a first main pixel, a second main pixel, and a third main pixel, the second main pixel being adjacent to the first main pixel in a row direction, the third main pixel being adjacent to the first pixel in a column direction,
wherein each of the first main pixel, the second main pixel, and the third main pixel includes a red pixel, green pixel, blue pixel, and white pixel,
the white pixel of the first main pixel is not adjacent to the blue pixels of the first main pixel, the second main pixel, and the third main pixel, and
the white pixel of the first main pixel is adjacent to the white pixel of the second main pixel and the third main pixel.

9. The display device according to claim 8, further comprising:
a fourth main pixel being adjacent to the first main pixel in an opposite direction of the row direction; and a fifth main pixel being adjacent to the first main pixel in an opposite direction of the column direction, wherein the blue pixel of the first main pixel is adjacent to the blue pixels of the fourth main pixel and the fifth main pixel.

* * * * *